US010862504B2

(12) United States Patent
Mitteregger

(10) Patent No.: US 10,862,504 B2
(45) Date of Patent: Dec. 8, 2020

(54) RADIO FREQUENCY BANDPASS DELTA-SIGMA ANALOG-TO-DIGITAL CONVERTERS AND RELATED METHODS

(71) Applicant: MEDIATEK Singapore Pte. Ltd., Singapore (SG)

(72) Inventor: Gerhard Mitteregger, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/533,497

(22) Filed: Aug. 6, 2019

(65) Prior Publication Data

US 2020/0076448 A1 Mar. 5, 2020

Related U.S. Application Data

(60) Provisional application No. 62/724,095, filed on Aug. 29, 2018.

(51) Int. Cl.
*H03M 3/00* (2006.01)
*H04B 1/00* (2006.01)

(52) U.S. Cl.
CPC ............. *H03M 3/402* (2013.01); *H03M 3/40* (2013.01); *H03M 3/464* (2013.01); *H03M 3/502* (2013.01); *H04B 1/0007* (2013.01)

(58) Field of Classification Search
CPC ...... H03M 3/402; H03M 3/464; H03M 3/502; H03M 3/40; H03M 3/50; H03M 7/3004; H03M 3/30; H04B 1/0007
(Continued)

(56) References Cited

U.S. PATENT DOCUMENTS 5,382,916 A 1/1995 King et al.
5,621,345 A 4/1997 Lee et al.
(Continued)

FOREIGN PATENT DOCUMENTS

EP 0221290 A2 5/1987
EP 0221290 A3 3/1989
(Continued)

OTHER PUBLICATIONS

Bechthum et al., A 5.3GHz 16b 1.75GS/s Wideband RF Mixing-DAC Achieving IMD<-82dBc up to 1.9GHz, IEEE International Solid States Circuits Conference, ISSCC 2015, Session 9, High-Performance Wireless, 9.6, 3 pages.
(Continued)

*Primary Examiner* — Jean B Jeanglaude
(74) *Attorney, Agent, or Firm* — Wolf, Greenfield & Sacks, P.C.

(57) ABSTRACT

Radio-frequency (RF) receivers having bandpass sigma-delta analog sigma analog-to-digital converters (ADC) designed to digitize signals in the RF domain are described. Such bandpass ADCs utilize one or more of the following techniques to enhance noise immunity and reduce power consumption: generation of in-phase (I) and quadrature (Q) paths in the digital domain, $n^{th}$ order resonant bandpass filtering with n>1, and signal sub-sampling in an $i^{th}$ Nyquist zone with i>1. Compared to RF receivers in which the I and Q paths are generated in the analog domain, these RF receivers exhibit higher IRRs because they are not susceptible to in-phase/quadrature (IQ) mismatch. Using $n^{th}$ order resonant bandpass filtering with n>1 attenuates unwanted image tones. The bandpass ADC-based RF receivers described herein exhibit enhanced immunity to noise, achieving for example image rejection ratios (IRR) in excess of 95 dB.

14 Claims, 6 Drawing Sheets

(58) Field of Classification Search
USPC .................................................. 341/143, 155
See application file for complete search history.

(56) References Cited

U.S. PATENT DOCUMENTS

| | | | |
|---|---|---|---|
| 6,337,647 B1 | 1/2002 | Masson et al. | |
| 6,621,438 B1 | 9/2003 | Hong | |
| 7,180,432 B2* | 2/2007 | Oliaei | H03M 3/40 341/143 |
| 7,675,996 B2* | 3/2010 | Johnson | H03D 7/00 375/316 |
| 8,401,050 B1* | 3/2013 | Fudge | H04B 1/0014 375/130 |
| 8,564,352 B2 | 10/2013 | Agrawal et al. | |
| 8,687,739 B1* | 4/2014 | Huynh | H04B 1/00 375/326 |
| 8,836,560 B2 | 9/2014 | Felder | |
| 9,608,672 B2 | 3/2017 | Naeini et al. | |
| 9,876,489 B1 | 1/2018 | Casey et al. | |
| 2003/0179028 A1 | 9/2003 | Kizer et al. | |
| 2004/0041604 A1 | 3/2004 | Kizer et al. | |
| 2005/0225465 A1 | 10/2005 | Zhang et al. | |
| 2008/0025437 A1 | 1/2008 | Huynh | |
| 2010/0283649 A1 | 11/2010 | Bos et al. | |
| 2013/0321709 A1 | 12/2013 | Daigle et al. | |
| 2014/0152479 A1 | 6/2014 | Felder | |
| 2020/0076446 A1 | 3/2020 | Egan | |

FOREIGN PATENT DOCUMENTS

| | | |
|---|---|---|
| EP | 3261258 A1 | 12/2017 |
| EP | 3301813 A1 | 4/2018 |

OTHER PUBLICATIONS

Beilleau et al., A 1.3V 26mW 3.2GS/s Undersampled LC Bandpass ΣΔ ADC for a SDR ISM-band Receiver in 130nm CMOS, 2009 IEEE Radio Frequency Integrated Circuits Symposium, pp. 383-386.
Chalvatzis et al., A 4.5 GHz to 5.8 GHz Tunable ΣΔ Digital Receiver with Q enhancement, IEEE MTT-S International, 2008, pp. 193-196.
Cherry et al., On the Design of a Fourth-Order Continuous-Time LC Delta-Sigma Modulator for UHF A/D Conversion, IEEE Transactions on Circuits and Systems—II: Analog and Digital Signal Processing, vol. 47, No. 6, Jun. 2000, pp. 518-530.
Duncan et al., A 10b DC-to-20GHz Multiple-Return-to-Zero DAC with >48dB SFDR, IEEE International Solid-State Circuits Conference, ISSCC 2017, Session 16, Gigahertz Data Converters, 16.6, 3 pages.
Engel et al., A 14b 3/6 GHz Current-Steering RF DAC in 0.18μm CMOS with 66dB ACLR at 2.9GHz, IEEE International Solid-State Circuits Conference, ISSCC 2012, Session 27, Data Converter Techniques, 27.1, 3 pages.
Erdmann et al., A 330mW 14b 6.8GS/s Dual-Mode RF DAC in 16nm FinFET Achieving—70.8dBc ACPR in a 20MHz Channel at 5.2GHz, IEEE International Solid-State Circuits Conference, ISSCC 2017, Session 16, Gigahertz Data Converters, 16.3, 3 pages.
Hussein et al., Bandpass ΣΔ Modulator Employing Undersampling and On-Chip Q-Enhanced LC Filter, IEEE, 1999 Southwest Symposium on Mixed Signal Design, pp. 47-51.
Naderi et al., On the Design of Undersampling Continuous-Time Bandpass Delta-Sigma Modulators for Gigahertz Frequency A/D Conversion, IEEE Transactions on Circuits and Systems—I: Regular Papers, vol. 55, No. 11, Dec. 2008, pp. 3488-3499.
Namdar et al., MP 3.7 A 400MHz 12b 18mW IF Digitizer with Mixer Inside a ΣΔ Modulator Loop, IEEE International Solid States Circuits Conference, ISSCC 1999, Session 3, Paper MP 3.7, 3 pages.
Park et al., A Digital-to-Analog Converter Based on Differential-Quad Switching, IEEE Journal of Solid-State Circuits, vol. 37, No. 10, Oct. 2002, pp. 1335-1338.
Ryckaert et al., A 2.4 GHz Low-Power Sixth-Order RF Bandpass ΣΔ Converter in CMOS, IEEE Journal of Solid-State Circuits, vol. 44, No. 11, Nov. 2009, pp. 2873-2880.
Schofield et al., A 16b 400MS/s DAC with <-80dBc IMD to 300MHz and <-160dBm/Hz Noise Power Spectral Density, IEEE International Solid-State Circuits Conference, ISSCC 2003, Session 7, DACs and AMPs, Paper 7.1, 10 pages.
Shibata et al., A DC-to-1 GHz Tunable RF ΣΔ ADC Achieving DR=74 dB and BW—150 MHz at ƒo-450 MHz Using 550 mW, IEEE Journal of Solid-State Circuits, vol. 47, No. 12, Dec. 2012, pp. 2888-2897.
Spiridon et al., A Linearity Improvement Technique for Overcoming Signal-Dependent Induced Switching Time Mismatch in DAC-Based Transmitters, ESSCIRC Conference 2015, 41st European Solid-State Circuits Conference (ESSCIRC), Sep. 14-18, 2015, pp. 347-347c.
Winoto et al., A Highly Reconfigurable 400-1700MHz Receiver Using a Down-Converting Sigma-Delta A/D with 59-dB SNR and 57-dB SFDR over 4-MHz Bandwidth, 2009 Symposium on VLSI Circuits Digest of Technical Papers, pp. 142-143.
U.S. Appl. No. 16/533,464, filed Aug. 6, 2019, Egan.
Extended European Search Report dated Nov. 29, 2019 in connection with European Application No. 19193433.0.
Extended European Search Report dated Jan. 20, 2020 in connection with European Application No. 19193421.5.
Sowlati et al., Single-chip multiband WCDMA/HSDPA/HSUPA/EGPRS transceiver with diversity receiver and 3G DigRF interface without SAW filters in transmitter / 3G receiver paths, 2009 IEEE International Solid-State Circuits Conference—Digest of Technical Papers, San Francisco, CA, 2009, pp. 116-117,117a.
Tohidian et al., A Fully Integrated Discrete-Time Superheterodyne Receiver, IEEE Transactions on Very Large Scale Integration (VLSI) Systems, vol. 25, No. 2, Feb. 2017, pp. 635-647.
Extended European Search Report dated Mar. 3, 2020 in connection with European Application No. 19212305.7.
EP 19212305.7, Mar. 3, 2020, Extended European Search Report.

* cited by examiner

RADIO FREQUENCY BANDPASS DELTA-SIGMA ANALOG-TO-DIGITAL CONVERTERS AND RELATED METHODS

CROSS REFERENCE TO RELATED APPLICATIONS

This Application claims priority under 35 U.S.C. § 119(e) to U.S. Provisional Application Ser. No. 62/724,095, entitled "RF BANDPASS DELTA SIGMA ADC/RF RECEIVER" filed on Aug. 29, 2018, which is herein incorporated by reference in its entirety.

TECHNICAL FIELD

The present application relates to delta-sigma analog-to-digital converters.

BACKGROUND

Delta-sigma analog-to-digital converters (ADC) use integrators, resonators and feedback loops to filter noise in the low frequencies, so as to enhance signal-to-noise ratio. Some delta-sigma ADCs include digital-to-analog converters (DAC) in the feedback loop.

BRIEF SUMMARY

Some embodiments relate to a method for processing a radio-frequency (RF) signal. The method comprises amplifying the RF signal; digitizing, with a delta-sigma analog-to-digital converter (ADC), the RF signal in an RF domain. The digitizing comprises filtering the RF signal with an $n^{th}$ order resonant bandpass filter, where n>1; sampling the RF signal in an $i^{th}$ Nyquist zone, where i>1; and producing an in-phase (I) signal and a quadrature (Q) signal digitally.

Some embodiments relate to a radio-frequency (RF) receiver comprising a low noise amplifier (LNA) and an RF domain delta-sigma analog-to-digital converter (ADC). The ADC comprises an $n^{th}$ order resonant bandpass filter, where n>1; a quantizer; and circuitry configured to: sample the RF signal in an $i^{th}$ Nyquist zone, where i>1; and produce an in-phase (I) signal and a quadrature (Q) signal digitally.

Some embodiments relate to a radio-frequency (RF) receiver comprising an analog-to-digital converter (ADC) configured to digitize an RF signal in an RF domain at least in part by: filtering the RF signal with an $n^{th}$ order resonant bandpass filter, where n>1; sampling the RF signal in an $i^{th}$ Nyquist zone, where i>1; and producing an in-phase (I) signal and a quadrature (Q) signal digitally.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

The inventor has recognized and appreciated that there is a need for compact, low-power, low-noise radio-frequency (RF) receivers based on bandpass analog-to-digital converters (ADCs). Compared to receivers designed to first convert the received RF signal to baseband and then to digitize the baseband signal, receivers that digitize the receiver RF signal in a bandpass fashion (directly in the RF domain), have several advantages. For one, these receivers, owing to the fact that RF domain digitization generally does not involve the use of local oscillators and mixers, are significantly smaller and more power efficient.

RF receivers based on bandpass ADCs exist. However, some of these implementations are too noisy and/or are too power hungry. The bandpass ADC-based RF receivers developed by the inventor are more immune to noise than other implementations, achieving for example image rejection ratios (IRR) in excess of 95 dB, and exhibit lower power consumptions. Such bandpass ADC-based RF receivers utilize one or more of the following techniques to enhance noise immunity and reduce power consumption: (1) generation of in-phase (I) and quadrature (Q) paths in the digital domain, (2) $n^{th}$ order resonant bandpass filtering with n>1, and (3) signal sub-sampling in an $i^{th}$ Nyquist zone with i>1.

In some embodiments, the I and Q paths are generated in the digital domain, for example using a digital signal processor. Compared to RF receivers in which the I and Q paths are generated in the analog domain, these RF receivers exhibit higher IRRs. This is because analog in-phase and quadrature paths are susceptible to in-phase/quadrature (IQ) mismatch, whereby one of more properties (e.g., gain, frequency, time delay, clock phase and clock magnitude) of the analog I path differs from those of the analog Q path due to fabrication tolerances and process-voltage-temperature variations (PVT).

In some embodiments, the IRR may be further enhanced by using an $n^{th}$ order resonant bandpass filter with n>1. These types of filters significantly attenuate image tones, unwanted tones that are inevitably generated in the RF receiver.

In some embodiments, the received RF signal is sub-sampled in an $i^{th}$ Nyquist zone with i>1. Sub-sampling RF signals in this manner leads to a significant reduction in power consumption and on-chip space usage because it relaxes the frequency with which the signal is sampled.

Figure 1:
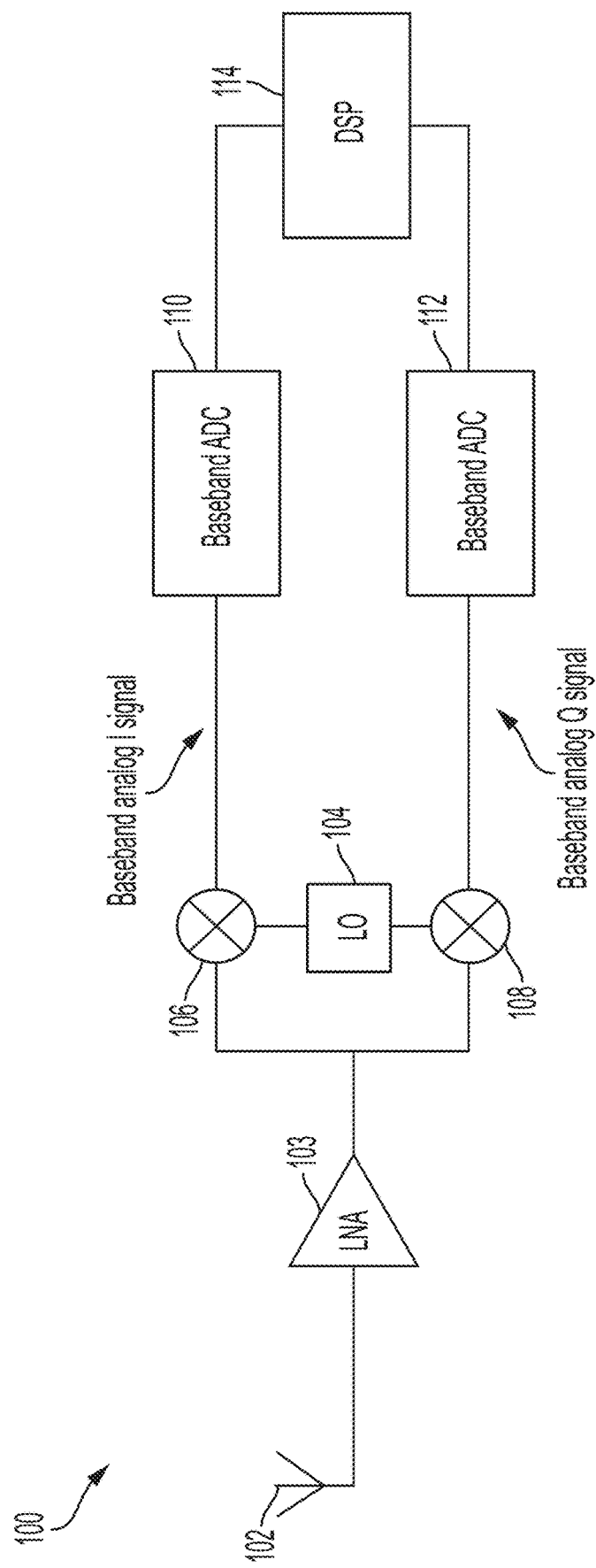
FIG. 1 is a block diagram illustrating a radio-frequency (RF) receiver including baseband ADCs.

RF receivers of the types described herein are designed to sample the received RF signal in the RF domain without first converting the RF signal to baseband. As such, in some embodiments, these RF receivers may lack local oscillators and/or may lack mixers. For comparison, FIG. 1 illustrates a baseband ADC-based RF receiver including a local oscillator and a pair of mixers. RF receiver 100 includes an antenna 102, a low noise amplifier (LNA) 103, a local oscillator (LO) 104, mixers 106 and 108, baseband ADCs 110 and 112 and digital signal processor (DSP) 114. As shown, the received signal is mixed, using mixers 106 and 108, to a tone provided by LO 104 to generate a baseband analog I signal and a baseband analog Q signal. The baseband analog I signal is digitized using baseband ADC 110 and the baseband analog Q signal is digitized using baseband ADC 112. The outputs of the ADCs are further processed using DSP 114.

Due to fabrication tolerances or process-voltage-temperature variations (PVT), one or more properties of the path over which the baseband analog I signal propagates may differ from that of the path over which the baseband analog Q signal propagates. This behavior leads to a deterioration of the IRR.

Figure 2:
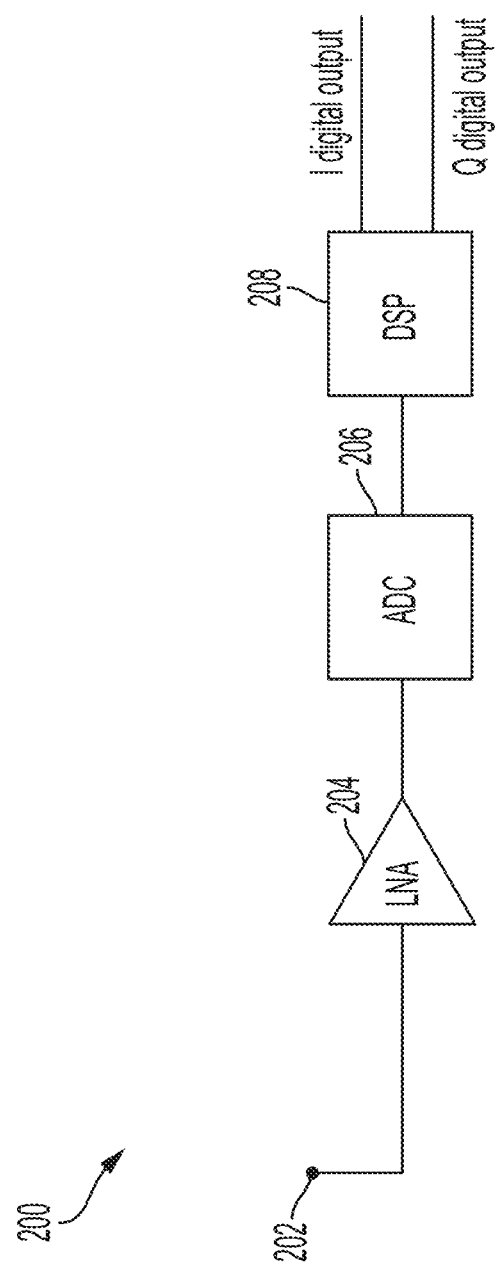
FIG. 2 is a block diagram illustrating a radio-frequency (RF) receiver including a bandpass ADC, in accordance with some embodiments.

By contrast, the RF receiver of FIG. 2 is designed to sample receiver RF signals in the RF domain, and to generate I and Q signals digitally. RF receiver 200 includes a receive node 202, LNA 204, ADC 206 and DSP 208. Receive node 202 may include an antenna, for example if the communication link is wireless, or other types of conductive terminals, for example if the communication link is wired. Being designed to digitize in the RF domain, in some embodiments, RF receiver 200 may lack local oscillators and/or mixers, though other embodiments may include local oscillators and/or mixers.

As will be described in detail further below, ADC 206 may be implemented as a delta-sigma ADC in some embodiments. As such, ADC 206 may be configured to shape the noise transfer function so that the noise power density at low frequencies is lower than the noise power density at higher frequencies. ADC 206 may be designed so that the signal being received falls in a frequency band in which the noise power density is lower. ADC 206 may include one or more low-pass filters or one or more bandpass filters for shaping the noise transfer function as desired.

In some embodiments, LNA 204 may be directly connected (with no components therebetween other than a conductive path) to ADC 206. Having a direct connection may enhance the signal-to-noise ratio of the RF signal being digitized. However, not all embodiments need to have a direct connection between LNA 204 and ADC 206.

As shown in FIG. 2, I and Q signals are generated in the digital domain, downstream from ADC 206. In this way, IQ mismatch that may otherwise arise when I and Q signals are generated in the analog domain (as in FIG. 1) is prevented. In some embodiments, ADC 206 may be configured to provide $n^{th}$ order resonant bandpass filtering (with n>1) and to sub-sample the received signal in an $i^{th}$ Nyquist zone with i>1.

Figure 3:
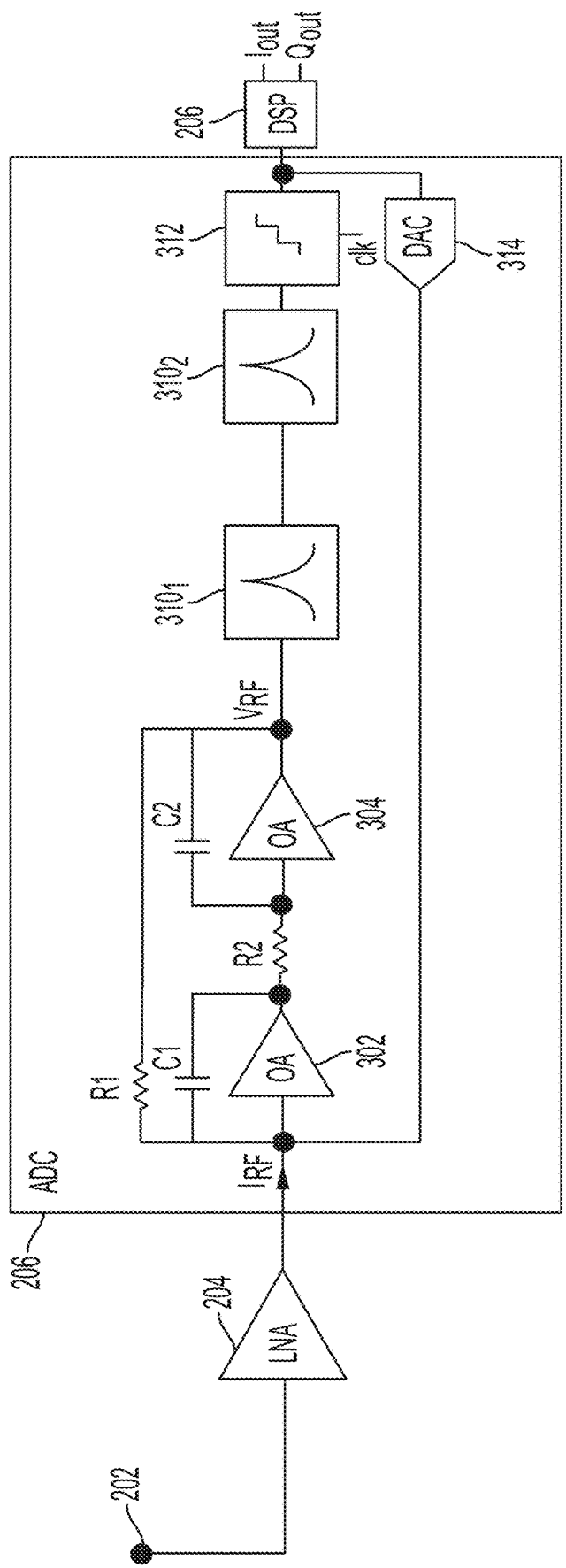
FIG. 3 is a block diagram illustrating a radio-frequency (RF) receiver including a bandpass delta-sigma ADC, in accordance with some embodiments.

FIG. 3 illustrates one non-limiting implementation of ADC 206, in accordance with some embodiments. In this implementation, ADC 206 includes operational amplifiers (OA) 302 and 304, resistors R1 and R2, capacitors C1 and C2, bandpass resonant filters $310_1$ and $310_2$, quantizer 312 and DAC 314. It should be appreciated that LNA 204 may be configured as a voltage amplifier and/or a current amplifier. In the example of FIG. 3, LNA 204 is configured to output an amplified current $I_{RF}$ that is representative of the signal received at receive node 202.

In some embodiments, the operational amplifiers, the resistors and the capacitors may be collectively configured as a transimpedance amplifier, thereby converting the current $I_{RF}$ to a voltage $V_{RF}$ at the output of OA 304. In the example of FIG. 3, the transimpedance amplification is provided by the presence of resistor R1 being connected between the input of OA 302 and the output of OA 304.

Furthermore, in some embodiments, the operational amplifiers, the resistors and the capacitors may be collectively configured as a lowpass or a bandpass filter (e.g., a bandpass resonant filter). In one example, OA 302 forms an integrator with capacitor C1 and resistor R1, and OA 304 forms an integrator with capacitor C2 and resistor R2. Because the integrators are connected in series, the feedback provided by resistor R1 is a negative feedback. The first integrator provides a 90 degree phase shift at the frequency at which the gain is equal to 1. With two integrators in series, the gain remains equal to one at such frequency and the total phase shift is 180 degrees, leading the integrators to behave as resonators. It should be noted that the circuit exhibits a resonance only at the frequency at which the gain is unitary.

In some embodiments including bandpass resonant filters, the quality factor of the filter may be adjustable, for example by using one or more controllable resistors.

It should be appreciated that arrangements other than that of FIG. 3 may be used in other embodiments. Other embodiments, for example, may include one operational amplifier or more than two operational amplifiers, and/or may include resistors and capacitors arranged in different ways.

In some embodiments, ADC 206 may include an $n^{th}$ order resonant bandpass filter with n>1. The inventor has appreciated that implementing resonant filters with orders greater than 1 may substantially enhance the IRR of the ADC. $N^{th}$ order resonant bandpass filters may be implemented in any suitable way, including using multiple bandpass resonant filters in series with each other. In FIG. 3, for example, ADC 206 includes bandpass resonant filter $310_1$ in series with bandpass resonant filter $310_2$. It should be appreciated that ADC 206 is not limited to including two bandpass resonant filters 310, as one or more than two filters may be used. Example implementations of such filters are described in detail further below.

In some embodiments, the first filter of the ADC (the filter that is closets to the LNA in the data path from the LNA to the DSP) may have a greater dynamic range than that of the subsequent filters. The dynamic range of the subsequent filters may be relaxed, relative to the first filter, because the loop gain of the ADC reduces noise and other impairments of the subsequent stages. In essence, the gain of the first resonator attenuates the noise of the subsequent stages. This, in turn, simplifies the design of filters $310_1$ and $310_2$.

Quantizer 312 maps the received RF signal to a set of predefined discrete values. The frequency at which the quantizer 312 samples the received RF signal may be dictated by the frequency of clock clk. In some embodiments, the frequency $f_s$ of clock clk may be selected so as to sample the received analog signal in an $i^{th}$ Nyquist zone, where i>1. As such, ADC 206 may be configured to sub-sample RF signals. For example, the sampling frequency $f_s$ may be less than $f_{RF}$, where $f_{RF}$ is the frequency of the RF signal received at receive node 202. Sub-sampling the received RF signal reduces the overall power consumption of ADC 206.

DSP 206 receives the output of ADC 206 and, in response, it produces an I output ($I_{out}$) and a Q output ($Q_{out}$). $I_{out}$ and $Q_{out}$ may be out-of-phase relative to each another by $\pi/2$, or more generally, by $\pm n\pi/2$ where n is an odd integer. Because the I and Q outputs are generated digitally, in some embodiments, ADC 206 may include a single data path, as opposed to a pair of data paths in quadrature to each other.

Figure 4:
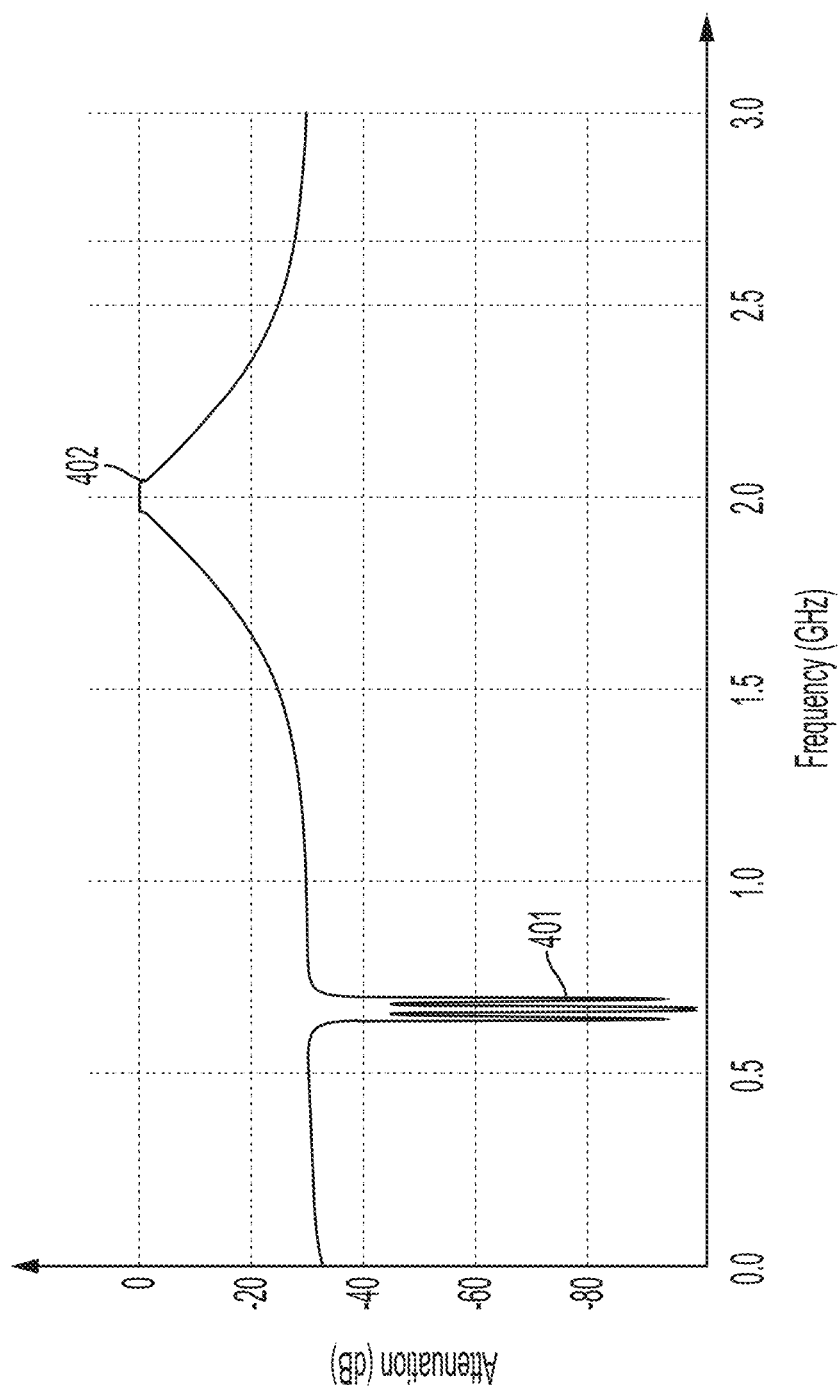
FIG. 4 is a plot illustrating an example of a frequency-dependent noise response of the receiver of FIG. 3, in accordance with some embodiments.

FIG. 4 illustrates an example frequency-dependent noise attenuation response of ADC 206, in accordance with some embodiments. In this example, the received RF signal is assumed to have a carrier frequency equal to approximately 2 GHz, though other values are also possible, including for example any value equal to or greater than 1 GHz.

In FIG. 4, the response exhibits a quantization noise stop band (and input signal stop band) 401 and a quantization noise stop band (and input signal pass band) 402. It should be noted that the quantization noise stop band 401 exhibits a sharp response with a large roll-off thanks to the use of an $n^{th}$ resonant bandpass filter, as described above. The quantization noise stop band 401 exhibits a dip with a −95 dB noise attenuation. In some embodiments, ADC 206 is designed so that the image tone falls within the quantization noise stop band 401. In such embodiments, ADC 206 may exhibit an IRR of 95 dB.

DAC 314 may be configured as a mixer DAC. As such DAC 314 may receive a signal having a certain frequency and may output a signal having a higher frequency. The up-conversion may be performed by mixing the signal being provided to the DAC with a reference signal. For example, in some embodiments, DAC 314 may up-convert the frequency output by quantizer 312 from a value between 2 GHz and 4 GHz to a value between 6 GHz and 12 GHz.

Figure 5:
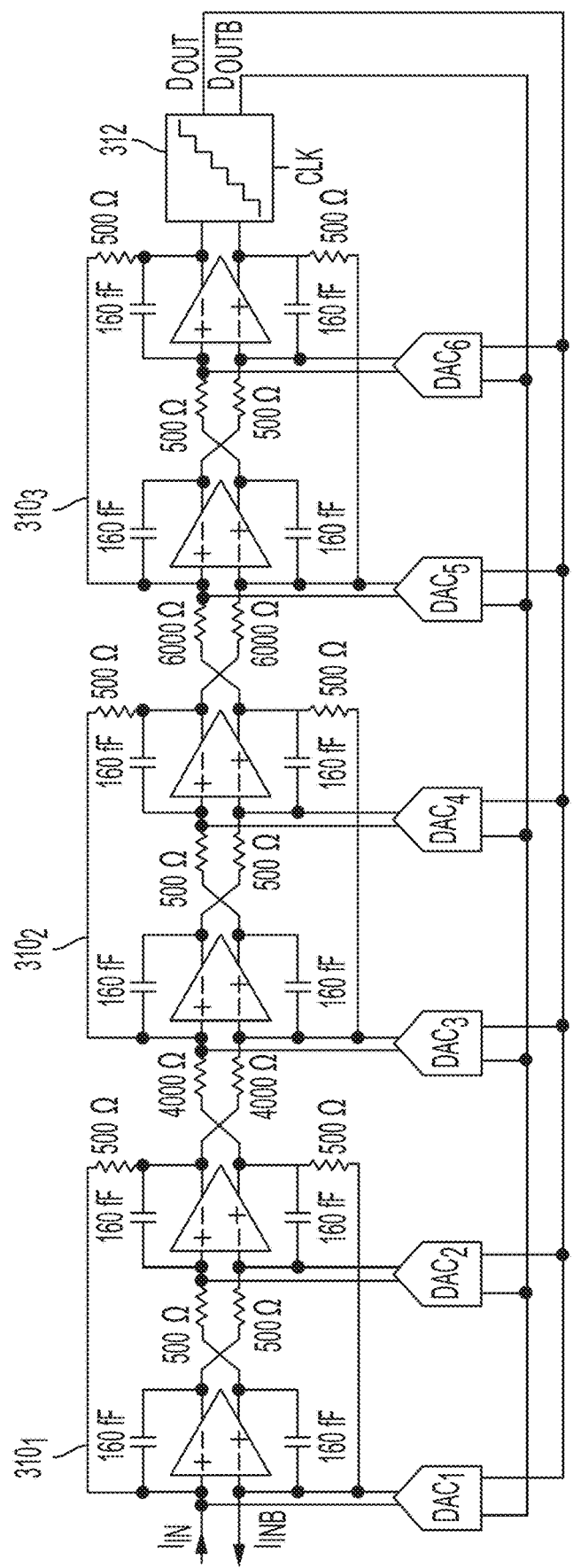
FIG. 5 is a block diagram illustrating resonant filters that may be used in connection with the receiver of FIG. 3, in accordance with some embodiments.

FIG. 5 illustrates one non-limiting implementation of the resonant filters 310, in accordance with some embodiments. In this case, three resonant filters $310_1$, $310_2$ and $310_3$ are shown. Each filter includes a pair of operational amplifiers, 500Ω-resistors and 160 fF-capacitors, though other resistances and capacitances are also possible. The filters are coupled to each other by pairs of resistors of increasing resistance. For example, filter $310_1$ is coupled to filter $310_2$ by a pair of 4000Ω-resistors while filter $310_2$ is coupled to filter $310_3$ by a pair of 6000Ω-resistors.

Each filter includes an inner feedback loop and an outer feedback loop. Each feedback loop includes a DAC coupled to the output of quantizer 312. $DAC_1$, $DAC_3$ and $DAC_5$ are part of the outer feedback loops of filters $310_1$, $310_2$ and $310_3$, respectively, and are connected to the inputs of such filters. $DAC_2$, $DAC_4$ and $DAC_6$ are part of the inner feedback loops of filters $310_1$, $310_2$ and $310_3$, respectively, and are connected to the respective second operational amplifiers of such filters.

In some embodiments, $DAC_1$ and $DAC_2$ may be designed as tri-level DACs and $DAC_3$, $DAC_4$, $DAC_5$ and $DAC_6$ may be designed as dual-level DACs. When the received digital signal is decoded into a dual-level format, the DAC may be configured to, triggered by an edge of the clock signal, steer current either from the positive output node to the negative output node or from the negative output node to the positive output node. By contrast, when the received digital signal is decoded into a tri-level format, the DAC may be configured to, triggered by an edge of the clock signal, steer current to the positive output node or the negative output node, or dump current to a floating node. When the received digital signal is decoded into a tri-level format, additional output switches may be configured to dump current to a floating node, which reduces noise.

In some embodiments, any one of the operational amplifiers described above, including OA 302, OA 304 and the operational amplifiers of FIG. 5, may be implemented using a multi-path operational amplifier. In some embodiments, the high gain provided by multi-path operational amplifiers leads to high resonator quality factors. Additionally, or alternatively, the high gain provided by multi-path operational amplifiers provides good virtual ground for the high sample rate DACs.

Figure 6:
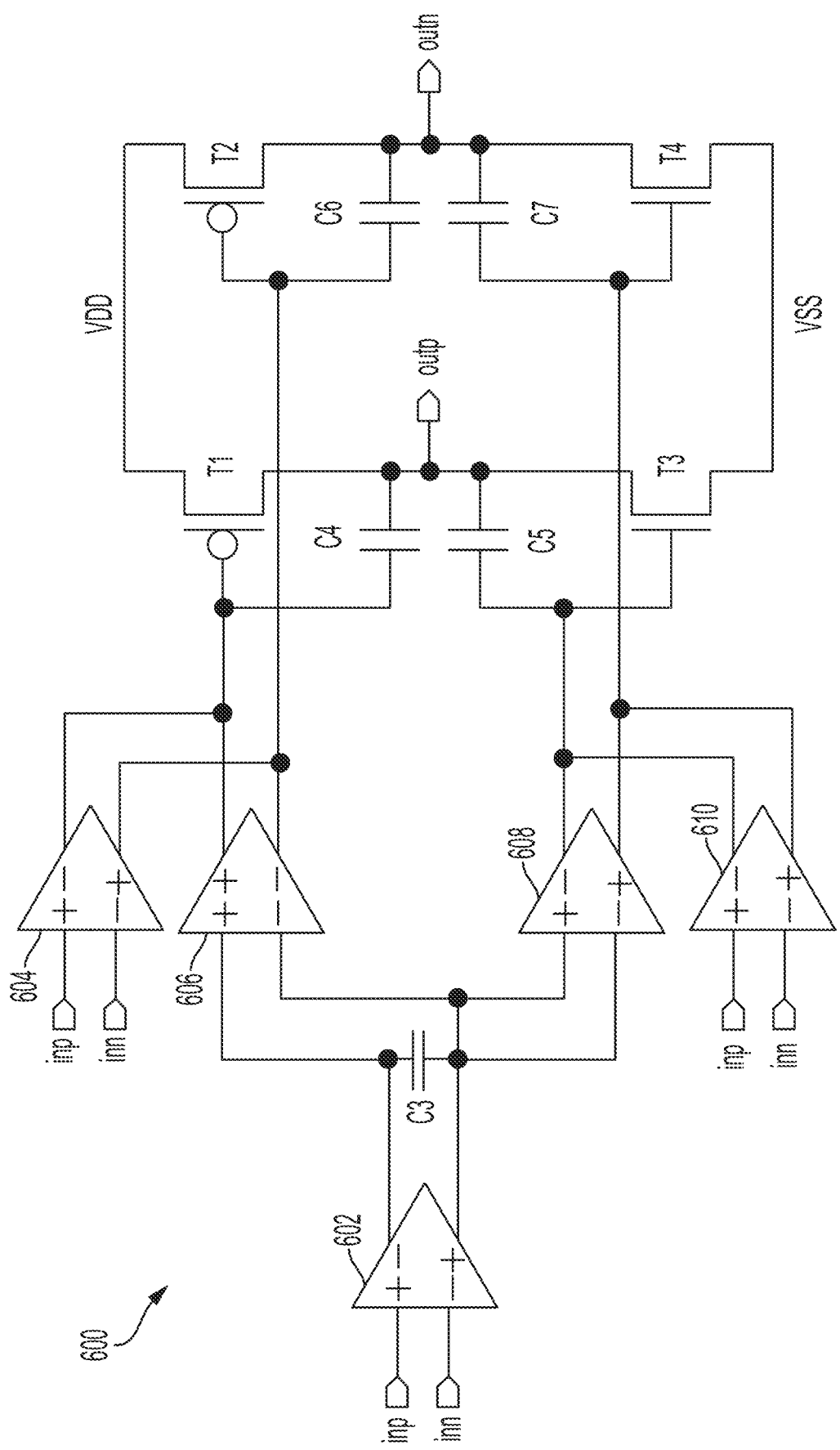
FIG. 6 is a circuit diagram illustrating an operational amplifier that may be used in connection with the receiver of FIG. 3, in accordance with some embodiments.

An example of a multi-path operational amplifier is shown in FIG. 6. Multi-path operational amplifier 600 forms a first path with differential operational amplifiers 602, 604 and 606 and a second path with differential operational amplifiers 602, 608 and 610. Multi-path operational amplifier 600 includes an output stage with transistors T1, T2 T3 and T4. Each pair of transistors (a first pair including T1 and T3 and a second pair including T2 and T4) may be arranged as an inverter. Capacitors C3, C4, C5, C6 and C7 may have any suitable capacitance.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A method for processing a radio-frequency (RF) signal, the method comprising;
    amplifying the RF signal;
    digitizing, with a delta-sigma analog-to-digital converter (ADC), the RF signal in an RF domain, wherein the digitizing comprises:
        filtering the RF signal with an $n^{th}$ order resonant bandpass filter, where n>1;
        sampling the RF signal in an $i^{th}$ Nyquist zone, where i>1;
        producing an in-phase (I) signal and a quadrature (Q) signal digitally; and
        converting an output of a quantizer with a digital-to-analog converter (DAC),
    wherein converting the output of the quantizer with the DAC comprises up-converting, by the DAC, a frequency of the output of the quantizer.

2. The method of claim 1, wherein amplifying the RF signal comprises amplifying the RF signal with a low noise amplifier directly connected to the ADC.

3. The method of claim 1, wherein filtering the RF signal with the $n^{th}$ order resonant bandpass filter comprises filtering the RF signal with a first filter and with a second filter downstream from the first filter, wherein the first filter has a greater dynamic range than the second filter.

4. The method of claim 1, wherein up-converting the frequency of the output of the quantizer comprises up-converting the frequency from 2-4 GHz to 6-12 GHz.

5. A method for processing a radio-frequency (RF) signal, the method comprising;
    amplifying the RF signal;
    digitizing, with a delta-sigma analog-to-digital converter (ADC), the RF signal in an RF domain, wherein the digitizing comprises:

filtering the RF signal with an $n^{th}$ order resonant bandpass filter, where n>1;

sampling the RF signal in an $i^{th}$ Nyquist zone, where i>1; and producing an in-phase (I) signal and a quadrature (Q) signal digitally, wherein filtering the RF signal with the $n^{th}$ order resonant bandpass filter comprises:

filtering the RF signal with a plurality of filters comprising a first filter and a second filter;

providing an output of a quantizer of the ADC to a first DAC and to a second DAC;

upconverting, by the first DAC, a frequency of the output of the quantizer; and providing an output of the first DAC to an input of the first filter and providing an output of the second DAC to an input of the second filter.

6. A radio-frequency (RF) receiver comprising:

a low noise amplifier (LNA); and an RF domain delta-sigma analog-to-digital converter (ADC) comprising:

an $n^{th}$ order resonant bandpass filter, where n>1;

a quantizer; and circuitry configured to:

sample a RF signal in an $i^{th}$ Nyquist zone, where i>1; and produce an in-phase (I) signal and a quadrature (Q) signal digitally, wherein the ADC further comprises a digital-to-analog converter (DAC) connected to an output of the quantizer, wherein the DAC is configured to up-convert a frequency of the output of the quantizer.

7. The RF receiver of claim 6, wherein the DAC is configured to up-convert the frequency from 2-4 GHz to 6-12 GHz.

8. The RF receiver of claim 6, wherein the LNA is directly connected to the ADC.

9. The RF receiver of claim 6, wherein the RF receiver lacks local oscillators.

10. A radio-frequency (RF) receiver comprising:

an analog-to-digital converter (ADC) configured to digitize an RF signal in an RF domain at least in part by:

filtering the RF signal with an $n^{th}$ order resonant bandpass filter, where n>1;

sampling the RF signal in an $i^{th}$ Nyquist zone, where i>1; and producing an in-phase (I) signal and a quadrature (Q) signal digitally, wherein the ADC is further configured to convert an output of a quantizer with a digital-to-analog converter (DAC), wherein the ADC is configured to convert the output of the quantizer with the DAC at least in part by up-converting a frequency of the output of the quantizer.

11. The RF receiver of claim 10, wherein up-converting the frequency of the output of the quantizer comprises up-converting the frequency from 2-4 GHz to 6-12 GHz.

12. The RF receiver of claim 10, wherein filtering the RF signal with the $n^{th}$ order resonant bandpass filter comprises:

filtering the RF signal with a plurality of filters comprising a first filter and a second filter;

providing an output of a quantizer to a first DAC and to a second DAC; and providing an output of the first DAC to an input of the first filter and providing an output of the second DAC to an input of the second filter.

13. A radio-frequency (RF) receiver comprising:

a low noise amplifier (LNA); and an RF domain delta-sigma analog-to-digital converter (ADC) comprising:

an $n^{th}$ order resonant bandpass filter, where n>1;

a quantizer; and circuitry configured to:

sample a RF signal in an $i^{th}$ Nyquist zone, where i>1; and produce an in-phase (I) signal and a quadrature (Q) signal digitally, wherein the $n^{th}$ order resonant bandpass filter comprises:

a plurality of filters comprising a first filter and a second filter;

a plurality of DACs comprising a first DAC and a second DAC, wherein the first and second DACs are connected to an output of the quantizer, the first DAC has an output connected to an input of the first filter and the second DAC has an output connected to an input of the second filter, wherein the first DAC is configured to up-convert a frequency of the output of the quantizer.

14. The RF receiver of claim 13, wherein the second filter is downstream from the first filter, wherein the first filter has a greater dynamic range than the second filter.

\* \* \* \* \*